United States Patent [19]

Higashi et al.

[11] 4,297,392
[45] Oct. 27, 1981

[54] HIGH FREQUENCY SPUTTERING PRODUCES THIN FILM AMORPHOUS SILICON PHOTOCONDUCTOR

[75] Inventors: Akio Higashi; Kazuhiro Kawaziri; Yosuke Nakajima, all of Asaka, Japan

[73] Assignee: Fuji Photo Film Co., Ltd., Minami-ashigara, Japan

[21] Appl. No.: 90,721

[22] Filed: Nov. 2, 1979

[30] Foreign Application Priority Data

Nov. 2, 1978 [JP] Japan ............................... 53-135179

[51] Int. Cl.³ .......................... B05P 5/12; G03G 5/08
[52] U.S. Cl. ........................................ 427/75; 338/15; 430/127; 430/128; 430/133; 430/84; 427/39
[58] Field of Search ....................... 430/127, 128, 133; 427/74, 124, 91, 39, 75; 338/15

[56] References Cited

U.S. PATENT DOCUMENTS 4,064,521 12/1977 Carlson ............................ 427/39 X
4,072,518 2/1978 Leder ............................... 427/39 X
4,151,058 4/1979 Kaplan ............................. 427/39 X
4,196,438 4/1980 Carlson ............................ 427/37 X

OTHER PUBLICATIONS

Paul et al., Solid State Communications, vol. 20, pp. 969-972 (1976).

Primary Examiner—John D. Welsh
Attorney, Agent, or Firm—Sughrue, Mion, Zinn, Macpeak and Seas

[57] ABSTRACT

In the course of producing a thin film of amorphous silicon by high frequency sputtering elemental silicon under an atmosphere containing at least hydrogen gas, the temperature of the base plate onto which the amorphous silicon is deposited is maintained at a temperature of about 50° C. to 150° C. The thus obtained silicon film possesses not only photoconductivity sufficient for use as a photoconductor but also a large difference between photoconductivity and dard conductivity. In addition, a photoconductor of an amorphous silicon thin film can be produced at low cost without environmental pollution problems.

6 Claims, 4 Drawing Figures

HIGH FREQUENCY SPUTTERING PRODUCES THIN FILM AMORPHOUS SILICON PHOTOCONDUCTOR

BACKGROUND OF THE INVENTION

1. Field of the Invention

The present invention relates to a method of producing a thin film photoconductor and particularly, to a method of producing a thin film photoconductor which is characterized by the use of amorphous silicon as a photoconductive material under such conditions that the thin film is suitable for use as a photoconductive element.

2. Description of the Prior Art

Photoconductive elements are generally employed as the light sensitive plate in electrophotographic elements and photoconductive cells. Those photoconductors which are prepared using crystalline or amorphous silicon as a photoconductive material are of particular interest because the silicon film itself is not poisonous, as opposed to, for example, selenium, CdS and the like.

Typical processes for producing photoconductors using elemental silicon include the step of drawing a single crystal ingot from a silicon melt according to Czochralski's process or a ribbon crystal growth process, and subsequently slicing or cutting the resulting single crystal in thin leaves. However, since these processes require a good deal of thermal energy in the course of the above-described proceedings, the production of a silicon film is expensive and consequently, an elements having large areas cannot be produced.

On the other hand, some processes for producing silicon photoconductors having a large area have been known. For instance, in Japanese Patent Application (OPI) No. 122471/'77 a process is described in which a thin film of amorphous silicon is produced using a silane gas by a glow discharge decomposition process. In this process, it is possible to produce thin films of silicon photoconductors having areas larger than those of conventional single crystal wafers. However, this process requires special precautions, because toxic silane gas is used in the production and further, it is necessary to maintain the temperature of the base plate at a relatively high temperature ranging from about 250° C. to 350° C. at the time of thin film formation. Such being the case, problems remain from the standpoint of preventing environmental pollution and reducing costs.

Another process for producing a large-area thin film of amorphous silicon is described in *Solid State Communication*, Vol. 20, pp. 969–972 (1976), in which the thin film of amorphous silicon is produced through high frequency sputtering of elemental silicon under an atmosphere containing argon and hydrogen gases. This process does not require the use of any poisonous materials but optimum conditions for producing the thin film of silicon are still not established. Notwithstanding the admonition that careful determination of conditions as optimum for producing excellent photoconductors will be required in the high frequency sputtering process, the aforementioned reference lacks description regarding the influence of changes in the temperature of the base plate and the partial pressure of hydrogen gas on the characteristics of the photoconductor. Usually, a semiconductor must not only have excellent photoconductivity but also a large difference between photoconductivity and dark conductivity to be suitable as a photoconductor element. Accordingly, when a thin film of amorphous silicon is produced for use as a thin film photoconductor, it is most important to establish such conditions as endow the film with the above-described characteristics.

SUMMARY OF THE INVENTION

Therefore, a first object of the present invention is to provide a method for producing a thin film photoconductor consisting of amorphous silicon at a low cost and without environmental pollution problems.

A second object of the present invention is to provide a process in which the thin film is produced under an atmosphere containing hydrogen gas according to a high frequency sputtering process using elemental silicon, and possesses not only excellent photoconductivity but also a large difference between photoconductivity and dark conductivity.

The above-described objects of the present invention are attained by attaching special conditions to the method of producing a thin film of amorphous silicon using elemental silicon under an atmosphere containing at least hydrogen gas by high frequency sputtering. Namely, the above-described objects are achieved by producing a thin film of amorphous silicon by high frequency sputtering of elemental silicon while keeping the base plate onto which amorphous silicon is deposited at about 50° C. to 150° C.

DETAILED DESCRIPTION OF THE INVENTION

The term "high frequency sputtering" as used herein refers to processes in which sputtering is carried out using bombarded ions which are generated by means of high frequency waves (for example; radio waves, ultraviolet rays, X-rays or γ-rays). Hydrogen gas introduced into the atmosphere at the time of high frequency sputtering can compensate the thin film of amorphous silicon for defects or energy gaps in its structure by the reaction of hydrogen. That is amorphous silicon inherently has many "dangling bonds" or vacancies in its electron orbitals. These vacancies can trap a charge carrier and detract from photoconductivity. By reaction with hydrogen however these vacancies are filled and good photoconductivity is obtained. The present invention is based on the face, that when thin films of amorphous silicon are produced in the above-described high frequency sputtering process, thin films of amorphous silicon having an excellent photoconductive, satifactorily low dark conductivity and, a large difference between photoconductivity and dark conductivity can be produced, if the temperature of the base plate is at about 50° C. to 150° C. and preferably 80° C. to 150° C.

The method of the present invention is carried out using known high frequency sputtering apparatuses as illustrated in detail in Chopra, *Thin Film Phenomena*, pp. 34–43, Mcgrow-Hill Book Company, New York (1969), etc.

Figure 1:
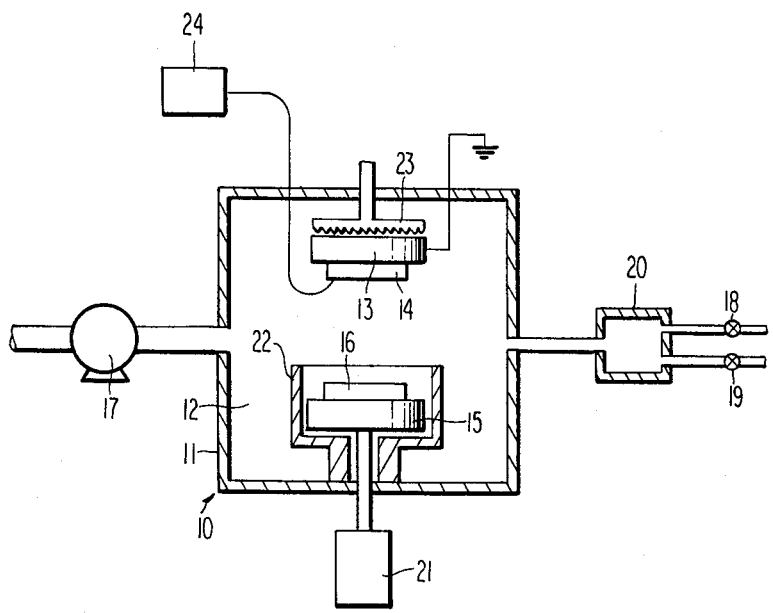
FIG. 1 is a schematic cross-section of a high frequency sputtering apparatus for conducting the method of the present invention.

FIG. 1 is a representative schematic of such a high frequency sputtering apparatus.

The present invention will be illustrated utilizing FIG. 1:

First, a base plate 14 is mounted on base plate supporting means 13 installed in a vacuum chamber 12 which is constructed of container walls 11, and a silicon target 16 is mounted on the target supporting means 15 arranged apart therefrom and at a position opposite the base plate 14. The silicon target is made of undoped crystalline or amorphous silicon which has a purity higher than 5 N (99.999%). The base plate can be plates, films and foils of glass, ceramics, organic high polymers, metals, alloys and the like. Next, the vacuum chamber 12 is evacuated with an exhaust pump 17 so that the background pressure inside the chamber 12 is about $1 \times 10^{-6}$ Torr or less, followed by introduction of both an inert gas (e.g., argon, neon, xenon, krypton and the like), which is a source for bombarding ions at the time of sputtering, and hydrogen gas into the vacuum chamber 12 through a leak valve 18 and variable leak valve 19, respectively. It is preferred to provide a mixing chamber 20 on one side of the vacuum chamber 12 in order to thoroughly mix the inert gas and the hydrogen gas. The hydrogen gas is mixed with the inert gas in a proportion of about 0.01 atomic % to 50 atomic % and preferably 5 atomic % to 40 atomic %. Moreover, it has proved to be particularly preferable from the standpoint of producing a thin film of amorphous silicon with high activation energy to mix the hydrogen gas in an mount of 7 atomic % to 30 atomic %. The mixed gas consisting of the inert gas and the hydrogen gas is introduced into the vacuum chamber 12 in such an amount that the pressure inside the vacuum chamber 12 is within the range of about $3 \times 10^{-2}$ Torr to $9 \times 10^{-2}$ Torr.

After the preparations described above are completed, sputtering is carried out by applying high frequency waves generated by means of a high frequency wave source 21 to the target supporting means 15 and on the other hand, grounding a base plate 14 directly or through the base supporting means 13 or applying a negative D.C. voltage to the base plate 14 with for the purpose of avoiding collisions of secondary electrons resulting from glow discharge with the deposited silicon. It is preferred to arrange a shield 22 around the target supporting means 15 in order to avoid discharge between the target supporting means 15 and the container walls 11. High frequency waves suitably applied to the target supporting means 15 are radio waves having frequencies ranging from about 1 MHz to 50 MHz. In addition, in case of application of negative D.C. voltage to the base plate a desirable voltage ranges from about 50 volts to 500 volts.

In the present invention, it is important that the temperature of the base plate 15 is maintained at a temperature ranging from about 50° C. to 150° C. and preferably from about 80° C. to 150° C. The maintenance of the base plate temperature is accomplished with a temperature adjusting means 23 arranged beneath the base plate supporting means, which corresponds to the side opposite to the base plate. The temperature adjusting means 23 installed with a variable heater alone is generally serviceable for the purpose of temperature control, but the temperature adjusting means 23 may be equipped with a combination of a heater and a cooler depending upon the circumstances. The temperature of the base plate 14 can be maintained within the above-described range by monitoring it with a thermocouple 24 whose detecting terminal is arranged in contact with the base plate surface facing the target and the temperature adjusting means 23 (for example, by raising or lowering the temperature depending upon the temperature detected). The base plate temperature may be varied in the course of sputtering provided that it is within the above-described temperature range.

A variation in deposition rate of amorphous silicon to the base plate is not believed to affect the characteristics of the thin film obtained, but a range of about 0.5 Å/sec to 10 Å/sec is desirable in the present invention.

A thin film of amorphous silicon produced in accordance with one embodiment of the present invention possesses not only excellent photoconductivity but also a large ratio of photoconductivity to dark conductivity (hereafter S-N ratio) and therefore, it has characteristics adequate for a thin film photoconductor.

The thickness of the amorphous silicon layer varies depending on the end use. Amorphous silicon has a lightabsorption coefficient of $10^2$ to $10^5$ cm$^{-1}$ to visible light and infrared light and thus the thickness of the thin film of amorphous silicon of the present invention is about 0.05 micron or more so as to sufficiently absorb light, and generally from 0.05 micron to 100 micron, preferably from 0.3 micron to 50 micron and particularly preferably from 0.6 micron to 50 micron. These ranges however should not be construed as limiting as one skilled in the art will recognize utilities for thicknesses outside these ranges.

Figure 2:
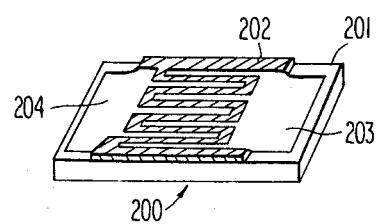
FIG. 2 is a schematic of a photoconductive cell which utilizes a thin film of amorphous silicon produced according to the method of the present invention.

A thin film of amorphous silicon produced in accordance with the present invention can be used as a light sensitive layer of a photoconductive cell as shown in FIG. 2 where photoconductive cell 200 contains on the base plate 201 a light sensitive layer 202 made of a thin film of amorphous silicon formed according to the present invention so that it has a thickness of about 0.05 micron to 10 microns and particularly, about 0.3 micron to 5 microns, and has thereon electrodes 203 and 204 each of which is made of such a metal or an alloy as to make ohmic contact with the light sensitive layer 202 (e.g., nickel, nichrome or the like) and is provided so as to cover the light sensitive layer in a comb-like form and such that they do not come into contact with each other in accordance with a known vacuum deposition process or a known electron beam deposition process. Since the light sensitive layer made of the thin film of amorphous silicon can exhibit an excellent photoconductivity when illuminated with light of wavelengths ranging from visible to infrared region and it has a large S-N ratio, light intensity can be precisely examined by means of this photoconductive cell.

Figure 3:
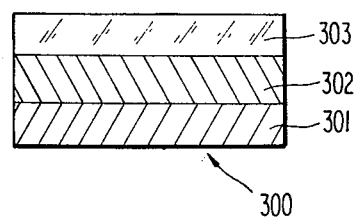
FIG. 3 is a cross-section of an electrophotographic element which utilizes a thin film of amorphous silicon produced according to the method of the present invention.

Further, a thin film of amorphous silicon produced in accordance with the present invention can also be used as a light sensitive layer of an electrophotographic element. The electrophotographic element 300 shown in FIG. 3 has, on a base plate 301 having a conductive surface, a light sensitive layer 302 made of the thin film of amorphous silicon formed by the method of the present invention so that the film has a thickness within the range of about 0.05 micron to 100 microns and particularly, about 0.3 micron to 50 microns, and has further an insulating layer 303 provided on the light sensitive layer 302. Examples of materials which can be used as the base plate 301 include those which are prepared by allowing conductive substances (e.g., metals such as nickel, aluminium, etc., alloys such as nichrome, etc., and inorganic compounds such as tin oxide, etc.) to deposit uniformly to the surfaces of plates or films of insulating materials such as glass, ceramics and organic high polymers; and plates, films or foils made up of conductive substances alone. In addition, examples of materials which can be employed as insulating layer 303 include films of light permeable, electrically insulating organic high polymers such as polyvinyl carbazole and the phenylmethane derivatives thereof, polyethylene terephthalate and the amine derivatives thereof, etc., and the insulating layer 303 is prepared from one of the above-described organic high polymers using a conventional coating or adhesion technique. Since this electrophotographic element has the insulating layer 303 arranged on the light sensitive layer 302 which is made of the thin film of amorphous silicon, the time constant of surface potential decay can be lengthened sufficiently in this element, notwithstanding its dark conductivity somewhat higher than that of selenium. In addition, due to the presence of the insulating layer the light sensitive layer can be prevented from being damaged at the time of corona discharge. Image formation by the use of this electrophotographic element 300 may be achieved by firstly loading positive or negative charges on the insulating layer 303 through corona discharge, and subsequently applying a light image to the electrophotographic element through imagewise exposure to result in the migration of negative or positive base charges across the light sensitive layer 302 towards the surface thereof and consequently, in the reduction of the surface potential in the areas where the migration of charges has occurred. Next, a second corona discharge and subsequent overall uniform exposure to light are carried out to produce a negative mode electric latent image.

As described above, the present invention enables the production of a thin film photoconductor, which is made of amorphous silicon alone, having both excellent photoconductive property and a high S-N ratio using inexpensive and harmless materials. Moreover, since high frequency sputtering is carried out with the base plate maintained at a relatively low temperature, i.e., at 50° C. to 150° C., not only is electric or thermal energy but also a base plate made of a thermoplastic material free from deformation or like defects. Therefore, the method of the present invention is very useful.

The present invention will now be illustrated in greater detail by reference to the following example.

EXAMPLE

Six samples of amorphous silicon thin films were prepared using the high frequency sputtering apparatus shown in FIG. 1 and carrying out high frequency sputtering using as the base plate a plate of slide glass (7059 Glass by Coring Glass) under the same conditions set forth below except that the temperature of the base plate was varied.

| | |
|---|---|
| Inert Gas | Argon |
| Concentration of Hydrogen Gas | 9-12 atomic % |
| Background Pressure inside Vacuum Chamber | $5 \times 10^{-2}$ Torr ($5 \times 10^{-7}$ Torr before the introduction of gas) |
| High Frequency Radiation | 13.56 MHz |
| Base Plate Temperature | 55° C., 120° C., 150° C., 180° C., 260° C. and 280° C. |

Each of the samples of amorphous silicon thin films produced was illuminated with light of a xenon lamp (50 mW/cm$^2$) through an IR cutting filter, and the photoconductivity thereof ($\Sigma_{photo}$) was measured. Then, the film was allowed to stand for a sufficiently long time in the dark, and the dark conductivity thereof ($\Sigma_{dark}$) was measured. The thus obtained values; i.e., $\Sigma_{photo}$, $\Sigma_{dark}$ and S-N ratio (that is $\Sigma_{photo}\Sigma_{dark})/\Sigma_{dark}$), are set forth in Table 1 and are plotted as a function of the base plate temperature in FIG. 4.

TABLE 1

| Base Plate Temperature | $\sigma_{dark}(\Omega^{-1} \cdot cm^{-1})$ | $\sigma_{photo}(\Omega^{-1} \cdot cm^{-1})$ | S-N Ratio |
|---|---|---|---|
| 55° C. | $1.09 \times 10^{-7}$ | $3.01 \times 10^{-7}$ | 2.68 |
| 120° C. | $3.09 \times 10^{-8}$ | $1.90 \times 10^{-7}$ | 5.15 |
| 150° C. | $1.94 \times 10^{-8}$ | $2.46 \times 10^{-8}$ | 0.27 |
| 180° C. | $1.51 \times 10^{-6}$ | $1.86 \times 10^{-6}$ | 0.23 |
| 260° C. | $2.37 \times 10^{-6}$ | $2.91 \times 10^{-6}$ | 0.23 |
| 280° C. | $4.29 \times 10^{-6}$ | $5.47 \times 10^{-6}$ | 0.28 |

Figure 4:
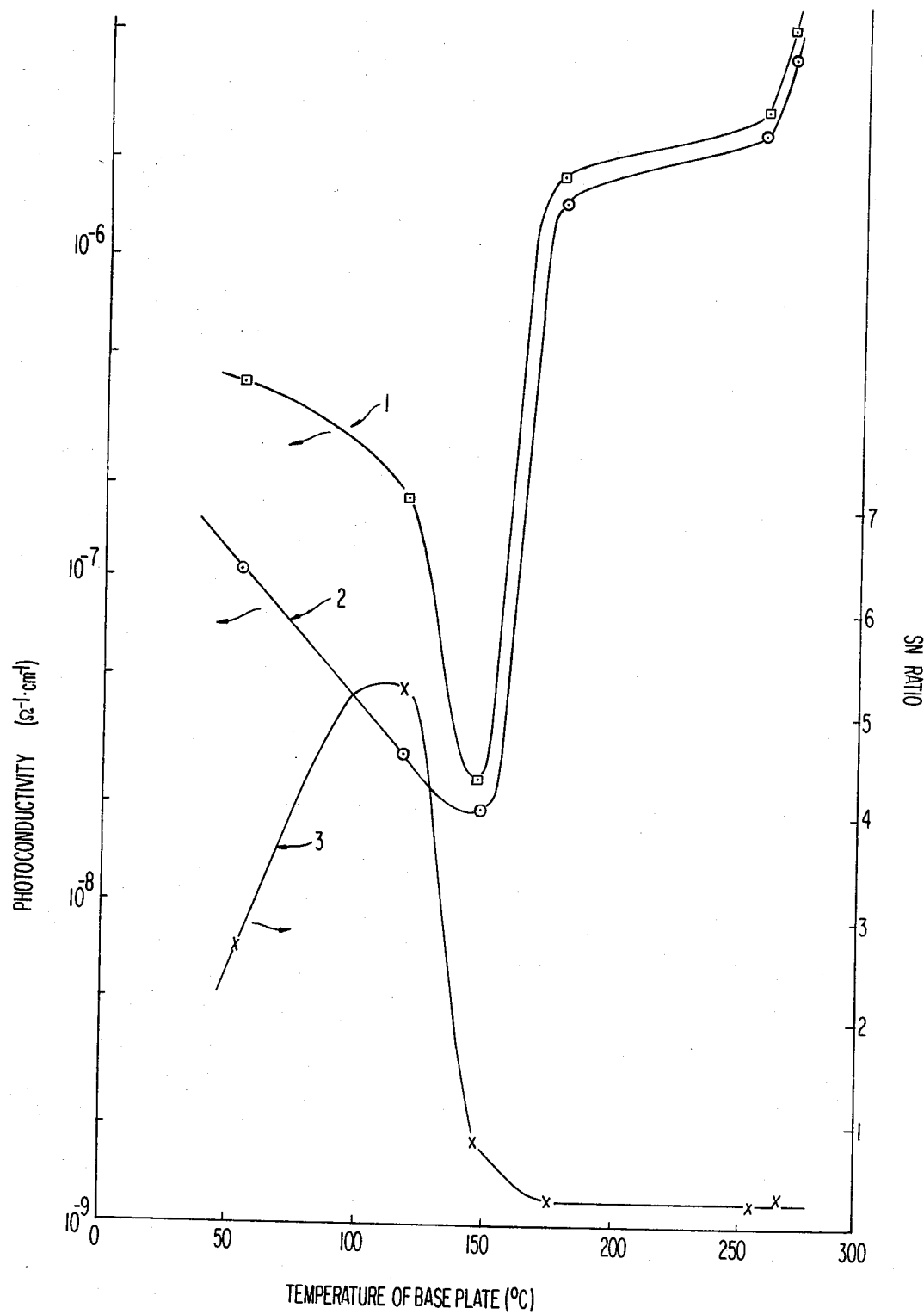
FIG. 4 graphically shows the relationships between change in the temperature of a base plate and photoconductivity, dark conductivity and the S-N ratio of a thin film amorphous silicon as shown in Table 1. In the figure, curve 1 is photoconductivity, curve 2 dark conductivity, and curve 3 the S-N ratio.

As can be seen from the results in Table 1 and FIG. 4, the absolute value of photoconductivity increases with an increase in base plate temperature above 150° C., but the S-N ratio decreases. Therefore, films produced utilizing a base plate whose temperature is within the range above 150° C. are undesirable as a photoconductor thin film. As compared with such a temperature range, in the case that the base plate used is maintained at a temperature within the range of 50° C. to 150° C., particularly temperatures in the vicinity of 120° C. being at the peak of effective temperature, thin films of amorphous silicon which have desirable characteristics for photoconductor, like high S-N ratio, could be obtained. In addition, the S-N ratio tends to decrease with a further drop in the case plate temperature below 50° C.

While the invention has been described in detail and with reference to specific embodiments thereof, it will be apparent to one skilled in the art that various changes and modifications can be made therein without departing from the spirit and scope thereof.

What is claimed is:

1. A photoconductor cell comprising
   a base plate;
   a light-sensitive layer on said base plate; and
   electrodes ohmically contacting said light-sensitive layer, wherein said light-sensitive layer comprises a thin film of amorphous silicon prepared by high frequency sputtering of elemental silicon under an atmosphere containing at least hydrogen onto said base plate, while maintaining the temperature of said base plate at about 50° C. to 150° C.

2. An electrophotographic element comprising
   a base plate with an electrically conductive surface;
   a light-sensitive layer on the electrically conductive surface of said base plate; and an electrically insulating layer on said light-sensitive layer, wherein said light-sensitive layer comprises a thin film of amorphous silicon prepared by high frequency sputtering of elemental silicon under an atmosphere containing at least hydrogen onto said base plate, while maintaining the temperature of said base plate at about 50° C. to 150° C.

3. The photoconductor cell of claim 2, wherein the temperature of said base plate is maintained at a temperature of about 80° C. to 150° C.

4. The photoconductor cell of claim 1, wherein said thin film of amorphous silicon has a thickness of 0.05 microns to 100 microns.

5. The electrophotographic element of claim 2, wherein the temperature of said base plate is maintained at a temperature of about 80° C. to 150° C.

6. The electrophotographic element of claim 2, wherein said thin film of amorphous silicon has a thickness of 0.05 microns to 100 microns.

* * * * *